United States Patent
Miura et al.

(10) Patent No.: US 11,560,622 B2
(45) Date of Patent: Jan. 24, 2023

(54) DEGRADABLE RESIN MOLDING AND PRODUCTION METHOD FOR DEGRADABLE RESIN MOLDING

(71) Applicant: MEIDENSHA CORPORATION, Tokyo (JP)

(72) Inventors: Toshinori Miura, Chiba (JP); Mitsuru Kekura, Numazu (JP); Naoto Kameda, Moriya (JP)

(73) Assignee: MEIDENSHA CORPORATION, Tokyo (JP)

( * ) Notice: Subject to any disclaimer, the term of this patent is extended or adjusted under 35 U.S.C. 154(b) by 0 days.

(21) Appl. No.: 17/298,178

(22) PCT Filed: Aug. 9, 2019

(86) PCT No.: PCT/JP2019/031539
§ 371 (c)(1),
(2) Date: May 28, 2021

(87) PCT Pub. No.: WO2020/110376
PCT Pub. Date: Jun. 4, 2020

(65) Prior Publication Data
US 2021/0388491 A1    Dec. 16, 2021

(30) Foreign Application Priority Data
Nov. 30, 2018    (JP) .............................. JP2018-225082

(51) Int. Cl.
*C23C 16/40*    (2006.01)
*C01B 21/082*    (2006.01)
(Continued)

(52) U.S. Cl.
CPC ........ *C23C 16/401* (2013.01); *C01B 21/0823* (2013.01); *C01B 33/126* (2013.01);
(Continued)

(58) Field of Classification Search
CPC . B32B 27/30; C23C 16/45565; C23C 16/401; C23C 16/402; C01B 33/126; B05D 7/04; B05D 3/148
See application file for complete search history.

(56) References Cited

U.S. PATENT DOCUMENTS

| | | | | |
|---|---|---|---|---|
| 5,100,720 | A | * | 3/1992 | Sawada .................. C08J 7/0423 428/215 |
| 5,334,454 | A | * | 8/1994 | Caporiccio .............. B05D 1/62 427/109 |

(Continued)

FOREIGN PATENT DOCUMENTS

| JP | H08-22580 B2 | 3/1996 |
|---|---|---|
| JP | H08-22583 B2 | 3/1996 |

(Continued)

OTHER PUBLICATIONS

Kameda et al., Properties of a CVD-SiO2 Film at Room Temperature by Active Species from High Purity Ozone Gas, Japan Society of Applied Physics, Extended Abstracts of the 79th JSAP Autumn Meeting, 2018, 1 page.

(Continued)

*Primary Examiner* — Joseph A Miller, Jr.
(74) *Attorney, Agent, or Firm* — Foley & Lardner LLP (57) ABSTRACT

Disclosed is a degradable film (1) in which a barrier layer (3) is disposed on a surface of a water-soluble polymer layer (2). The water-soluble polymer layer (2) is made of a water-soluble polymer such as polyvinyl alcohol or polyvinyl pyrrolidone. The barrier layer (3) is made of silicon oxide or silicon oxynitride. The barrier layer (3) is formed on the water-soluble polymer layer (2) by a CVD process with the supply of a raw material gas containing a precursor of a substance that forms the barrier layer (3), an ozone gas with an oxygen concentration of 20 vol % or higher and an (Continued)

unsaturated hydrocarbon gas to the water-soluble polymer layer (2).

5 Claims, 4 Drawing Sheets

(51) Int. Cl.
    *C01B 33/12*     (2006.01)
    *C08J 7/06*     (2006.01)
    *C23C 16/30*     (2006.01)
    *C23C 16/455*     (2006.01)

(52) U.S. Cl.
    CPC .............. *C08J 7/06* (2013.01); *C23C 16/308* (2013.01); *C23C 16/45565* (2013.01); *C08J 2329/04* (2013.01); *C08J 2339/06* (2013.01)

(56) References Cited

U.S. PATENT DOCUMENTS

| | | | |
|---|---|---|---|
| 6,432,516 | B1 | 8/2002 | Terasaki et al. |
| 2004/0038051 | A1* | 2/2004 | Fujisawa ............. H01L 31/0236 428/469 |
| 2014/0370270 | A1 | 12/2014 | Kaminaga et al. |
| 2018/0148558 | A1* | 5/2018 | Miura .................... C01B 13/10 |
| 2021/0028011 | A1 | 1/2021 | Kameda et al. |

FOREIGN PATENT DOCUMENTS

| | | | |
|---|---|---|---|
| JP | 2001-304756 | A | 10/2001 |
| JP | 2003-020209 | A | 1/2003 |
| JP | 2010-221595 | | 10/2010 |
| JP | 2010-284855 | A | 12/2010 |
| JP | 2013-207005 | | 10/2013 |
| JP | 2013-208901 | A | 10/2013 |
| WO | WO 98/46424 | A1 | 10/1998 |
| WO | WO2016-186096 | * | 5/2016 |
| WO | WO 2016/186096 | A1 | 11/2016 |
| WO | WO 2019/187337 | A1 | 10/2019 |

OTHER PUBLICATIONS

Japanese Office Action and English translation, Application No. 2018-225082, dated Oct. 8, 2019, 8 pages.

* cited by examiner

DEGRADABLE RESIN MOLDING AND PRODUCTION METHOD FOR DEGRADABLE RESIN MOLDING

FIELD OF THE INVENTION

The present invention relates to a degradable resin molded article and a method for producing a degradable resin molded article.

BACKGROUND ART

In recent years, the influences of plastic products dumped in the sea etc. on the natural environment and ecosystem have become problems. It is considered problematic that not only dumped plastic products themselves but also fine particles (called microplastics) generated by decomposition of pumped plastic products in the environment exert many influences on the sea and the ecosystem living in the sea.

For example, the report compiled by the Organization for Economic Cooperation and Development (OECD) on Aug. 4, 2018 reveals that: the amount of plastic waste generated in the world exceeds 300 million tons per year; and the damage caused to the tourism and fining industries by flow of plastic waste into the environment comes up to about 130 million dollars (about 1.4 trillion yens) per year. Further, the amount of plastic waste buried in the environment by dumping or landfill disposal is increasing and is estimated to reach about 130 million tons on the year of 2025.

Against a measure against these problems, a major U.S. coffee chain has announced that it will completely abolish the use of disposable plastic straws in stores around the world. The other companies are taking similar measures.

Furthermore, there have been proposed films in which vapor deposited coatings of silicon are applied to base films of polyvinyl alcohol (also referred to as PVA; the same shall apply hereinafter), respectively; as gas-barrier films capable of maintaining low oxygen permeability and water vapor permeability even under high-humidity conditions (see, for example, Patent Documents 1 to 3).

PRIOR ART DOCUMENTS

Patent Documents

Patent Document 1: Japanese Unexamined Patent Publication No. 2010-221595
Patent Document 2: Japanese Examined Patent Publication No. H08-22580
Patent Document 3: Japanese Examined Patent Publication No. H08-22583
Patent Document 4: Japanese Unexamined Patent Publication No. 2013-207005

SUMMARY OF THE INVENTION

As alternatives to plastic products, paper products and biodegradable plastic products have been proposed. However, the problem of water resistance remains in the paper products. The biodegradable plastic products face the problem that they are decomposed only in a special environment and are hardly decomposed when dumped into sea.

Further, sputtering, vapor deposition and CVD (plasma CVD, thermal CVD etc.) are commonly known as processes for forming $SiO_2$ films on substrate films of PVA or the like. In these processes, it is necessary to heat the substrate film (such as PVA film) to 100° C. or higher in order to ensure the barrier property of the $SiO_2$ film. These processes are applicable to high heat-resistant films such as polyethylene naphthalate (PEN) films. However, the PVA is low in heat resistance so that it is difficult to form a SiO2 film by these processes on the PVA film.

The present invention has been made in view of the above circumstance. It is accordingly an object of the present invention to provide a degradable resin molded article having less load on the environment even if dumped in sea and capable of being mass-produced. It is also an object of the present invention to provide a production method of a degradable resin molded art.

One aspect of the present invention to achieve the above object is a degradable resin molded article comprising: a water-soluble polymer layer containing polyvinyl alcohol or polyvinyl pyrrolidone; and a barrier layer provided on a surface of the water-soluble polymer layer, wherein the barrier layer is formed of a silicon oxide film or silicon oxynitride film, and wherein at least a pair of the barrier layers are provided so as to sandwich therebetween the water-soluble polymer layer.

The water-soluble polymer layer may preferably contain polyvinyl alcohol having an average polymerization degree of 1000 or lower and a saponification degree of 100 mol % or lower.

Another aspect of the present invention to achieve the above object is a production method of a degradable resin molded article, the degradable resin molded article comprising a water-soluble polymer layer containing polyvinyl alcohol or polyvinyl pyrrolidone and a barrier layer provided on a surface of the water-soluble polymer layer, the production method comprising: providing the water-soluble polymer layer in a vacuum chamber; and supplying, to the water-soluble polymer layer provided in the vacuum chamber, an ozone gas with an ozone concentration of 20 vol % or higher, a raw material gas containing a precursor of a substance that forms a silicon oxide film or a silicon oxynitride film as the barrier layer, and an unsaturated hydrocarbon gas, thereby forming the barrier layer on the water-soluble polymer layer.

The precursor may preferably be a compound selected from the group consisting of silane, tetraethyl orthosilicate, trimethoxysilane, triethoxysilane and tris(dimethylamino) silane.

The barrier layer may preferably have a thickness larger than or equal to 1 nm and smaller than or equal to 10 μm.

In the vacuum chamber, there may be provided a first roll around which the water-soluble polymer layer has been wound; a second roll by which the water-soluble polymer layer fed from the first roll is wound up; and a shower head from which the ozone gas, the raw material gas and the unsaturated hydrocarbon gas are supplied to the water-soluble polymer layer, so as to feed the water-soluble polymer layer from the first roll to the second roll and form the barrier layer on the water-soluble polymer layer by the supply of the ozone gas, the raw material gas and the unsaturated hydrocarbon gas from the shower head onto the water-soluble polymer layer moving between the first roll and the second roll.

Furthermore, a pair of shower heads may be provided, with gas supply surfaces of the shower heads being opposed to each other, so as to feed the water-soluble polymer layer to pass between the opposed shower heads and form the barrier layer on both surfaces of the water-soluble polymer layer by the supply of the ozone gas, the raw material gas and the unsaturated hydrocarbon gas from the pair of the shower heads onto the water-soluble polymer layer moving between the first roll and the second roll.

The degradable resin molded article and the production method of the degradable resin molded art according to the above-described aspects of the present invention are advantageous in that the degradable resin molded article has less load on the environment even if dumped in sea and can be mass-produced.

BRIEF DESCRIPTION OF DRAWINGS

FIG. 5 is a schematic view showing the degradability of the degradable film according to one embodiment of the present invention, where FIG. 5(a) shows the film before decomposition; FIG. 5(b) shows the film during immersion in seawater; FIG. 5(c) shows the film in a state that a water-soluble polymer layer gets swollen; and FIG. 5(d) shows a decomposed state of the film.

DESCRIPTION OF EMBODIMENTS

Hereinafter, a degradable resin molded article and a production method of a degradable resin molded article according to embodiments of the present invention will be described in detail below with reference to the drawings.

Figure 1:
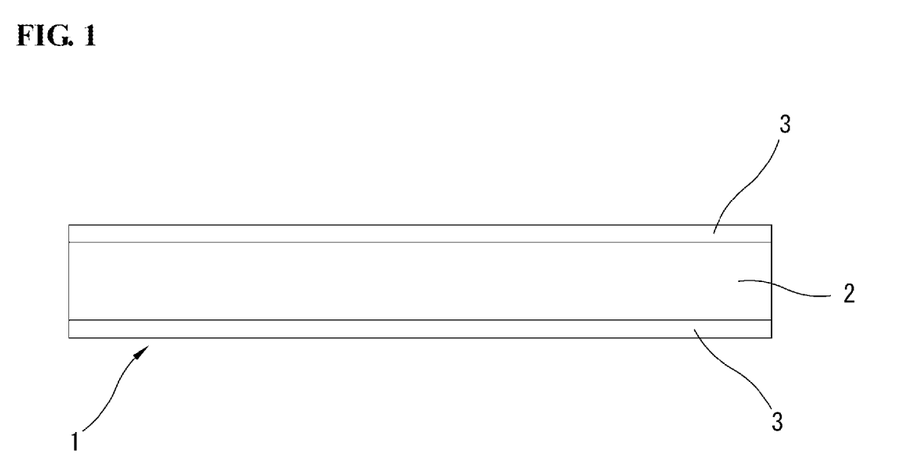
FIG. 1 is a cross-sectional view of a degradable film according to one embodiment of the present invention.

As shown in FIG. 1, a degradable film 1 according to one embodiment of the present invention includes a water-soluble polymer layer 2 and a barrier layer 3.

The water-soluble polymer layer 2 is fixated of a water-soluble polymer such as PVA or polyvinyl pyrrolidone. The PVA is obtained by, for example, polymerizing a vinyl acetate monomer and subjecting the resulting polyvinyl acetate resin to saponification. The PVA is also called "poval" and is used for industrial applications. The average polymerization degree and saponification degree of the PVA, or the average polymerization degree of the polyvinyl pyrrolidone, as the constituent material of the water-soluble polymer layer 2 can be set within the range that does not impair the solubility of the water-soluble polymer layer 2. From the viewpoint of water solubility, for example, it is preferable that: the average polymerization degree of the PVA or polyvinyl pyrrolidone is lower than or equal to 1000; the saponification degree of the PVA is lower than or equal to 100 mol %, more preferably lower than or equal to 90 mol %. The average polymerization degree and saponification degree can be determined by e.g. a polyvinyl alcohol testing method specified in JIS (Japanese Industrial Standard) K 6726: 1994. The higher the polymerization degree and saponification degree, the lower the water solubility, the higher the durability. Hence, the average polymerization degree and saponification degree of the water-soluble polymer are set according to the purpose of use. For use in beverage containers, for example, the average polymerization degree and saponification degree of the water-soluble polymer are set relatively high. In the case where the average polymerization degree and saponification degree of the water-soluble polymer are set to very high values, the water-soluble polymer layer 2 becomes poorly soluble. Although the poorly water-soluble polymer layer 2 is usable as a plastic product, the use of such a poorly water-soluble polymer layer 2 could be detrimental to the object of the present invention.

To form the water-soluble polymer layer in a film shape, various compounding agents and additives may be added to the water-soluble polymer layer 2 for the purpose of improving the workability, heat resistance, weather resistance, mechanical properties, dimensional stability and the like of the film. More specifically, there can be used any of slip additives, cross-linking agents, antioxidants, UV absorbers, light stabilizers, fillers, reinforcing agents, pigments and other additives.

The barrier layer 3 is formed, as a layer having at least water vapor barrier property, by CVD on the water-soluble polymer layer 2. The barrier layer 3 is preferably formed of silicon oxide ($SiO_2$) or silicon oxynitride (SiON). It is particularly preferable that the barrier layer 3 is in the form of a $SiO_2$ film or a SiON film so that the degradable film 1 is good in transparency (or translucency) and is harmless having less influence on the environment after decomposition. The thickness of the barrier layer 3 is set according to the water vapor barrier property of the barrier layer, the productivity of the degradable film 1 and the like. For example, the thickness of the barrier layer 3 is preferably 1 nm to 10 μm, more preferably 10 nm to 1 μm.

Figure 2:
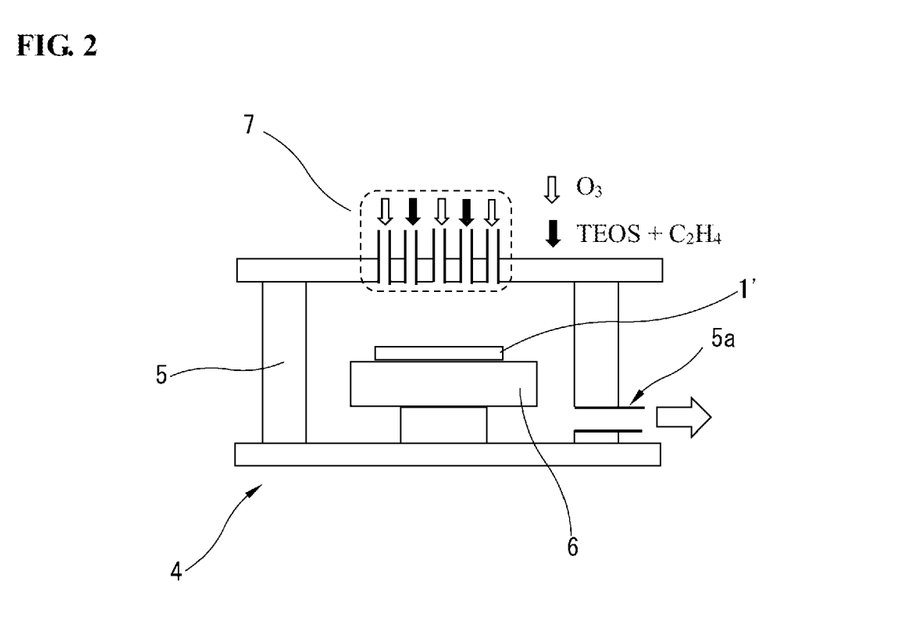
FIG. 2 is a cross-sectional overview of a film forming device according to a first embodiment example of the present invention.

Next, an explanation will be given of a method for production of the degradable film 1. A film forming device 4 according to a first embodiment example of the present invention is shown in FIG. 2.

The barrier film 3 is formed by chemical vapor deposition (CVD) using the reaction of a raw material gas containing a precursor of a substance that forms the barrier film 3, an ozone gas and an unsaturated hydrocarbon gas. For example, the barrier film 3 can be formed by a CVD process disclosed in Japanese Patent Application No. 2018-060983.

The film forming device 4 includes a vacuum chamber 5 and a support base 6 disposed in the vacuum chamber 5. A degradable film 1' is placed on the support base 6. Herein, the degradable film 1' is a film having the water-soluble polymer layer 2 before the formation of the barrier layer 3.

The film forming device also includes a shower head 7 arranged opposed to the support base 6 inside the vacuum chamber 5 (that is, opposed to a surface of the degradable film 1' on which the barrier layer 3 is to be formed) such that the ozone gas, the raw material gas and the unsaturated hydrocarbon gas are supplied from the shower head 7. The gases supplied from the shower head 7 are fed to the degradable film 1' and evacuated from the vacuum chamber through a discharge port 5a. It is feasible to supply the gases from respective separate holes of the shower head 7 or to mix two or more of the gases in advance and supply the mixed gas from the shower head 7.

It is preferable that the ozone concentration of the ozone gas is as high as possible. The ozone concentration (in volume %) of the ozone gas is preferably in a range of e.g. 20 to 100 vol %, more preferably 80 to 100 vol %, still more preferably 90 to 100 vol %. The reason for this is that, as the ozone concentration of the ozone gas is closer to 100 vol %, a reactive species (OH) generated from the ozone is brought into contact with a surface of the degradable film 1' at a higher density. The reactive species (OH) not only participates in the reaction required for chemical vapor deposition, but also reacts with carbon (C) contained in the barrier layer 3 to remove the carbon (C) in gaseous form. Consequently, the barrier layer 3 is formed with less impurity by supplying a larger amount of the reactive species (OH) to the surface of the degradable film 1'. In view of the tendency that the higher the ozone concentration of the ozone gas (that is, the lower the oxygen concentration of the ozone gas), the longer the lifetime of atomic oxygen (O) generated by dissociation of the ozone, it is preferable to use the ozone gas of high concentration. More specifically, the oxygen concentration is decreased with increase of the ozone concentration so that the atomic oxygen (O) is prevented from being deactivated by collision with the oxygen molecule. Further, the process pressure during the deposition of the barrier layer 3 can be decreased with increase of the ozone concentration. It is thus preferable to use the high-concentration ozone gas from the viewpoint of gas flow control and gas flow improvement.

The flow rate of the ozone gas is preferably in a range of e.g. 0.2 sccm or higher, more preferably 0.2 to 1000 sccm. The unit "sccm" expresses sec ($cm^3$/min) at 1 atm (1013 hPa) and 25° C.

The high-concentration ozone gas can be obtained by liquefying and separating ozone from an ozone-containing gas on the basis of a difference in vapor pressure, and then, gasifying the liquefied ozone. As a device for generating the high-concentration ozone gas, there can be used any of ozone gas generators disclosed in patent documents such as Japanese Unexamined Patent Publication No. 2001-304756 and Japanese Unexamined Patent Publication No. 2003-20209. These high-concentration ozone gas generators are each configured to generate a high-concentration ozone gas (ozone concentration≈100 vol %) by isolating ozone through liquefaction separation based on a difference in vapor pressure between ozone and another gas (e.g. oxygen). The ozone gas generator, particularly of the type having a plurality of chambers for liquefying and gasifying ozone, enables continuous supply of the high-concentration ozone gas by individual temperature control of the chambers. One commercially available example of the high-concentration ozone gas generator is Pure Ozone Generator (MPOG-HM1A1) manufactured by Meidensha Corporation.

The raw material gas used is a gas containing as a constituent element thereof an element that forms the barrier layer 3 (e.g. an element that forms silicon oxide ($SiO_2$) or silicon oxynitride (SiON)). Specific preferred examples of the raw material gas include gases of silane (that is a generic name for hydrogen silicate), TEOS (tetraethyl orthosilicate), TMS (trimethoxysilane), TES (triethoxysilane), 3DMAS (tris(dimethylamino)silane; $SiH(NMe_2)_3$) and the like.

The unsaturated hydrocarbon gas used is a gas of double bond-containing hydrocarbon (called alkene) typified by ethylene or a gas of triple bond-containing hydrocarbon (called alkyne) typified by acetylene. Specific preferred examples of the unsaturated hydrocarbon gas include, not only gases of ethylene and acetylene, but also gases of low-molecular weight unsaturated hydrocarbons (e.g. unsaturated hydrocarbons having a carbon number n of 4 or smaller) such as butylene.

For the formation of the barrier layer 3, the ozone gas (e.g. ozone gas with an ozone concentration of 90% or higher), the raw material gas (e.g. TEOS-containing gas) and the unsaturated hydrocarbon gas (e.g. ethylene gas) are simultaneously supplied and blown from the shower head 7 onto the degradable film 1' placed on the support base 6 inside the vacuum chamber 5. Since TEOS is liquid and cannot be supplied in gaseous form as it is, the TEOS-containing gas supplied is a gas in which a liquid of TEOS is bubbled using an inert gas such as nitrogen gas as an inert gas.

The above-mentioned method enables deposition of e.g. a uniform $SiO_2$ film on the surface of the degradable film 1' without heating the degradable film 1'. For example, a favorable $SiO_2$ film is deposited under the process conditions that the ratio of the respective reaction-contributing gases is controlled such that, with respect to the flow rate of ozone defined as 1, the flow rate of ethylene is 0.1 to 2 and the flow rate of TEOS is 0.001 to 0.1; and the film deposition pressure is 1 Pa to 1000 Pa. The effect of oxidation of the ozone in the reaction of the ozone and ethylene is more enhanced by controlling the flow rate of the ethylene to be 0.1 to 1 with respect to the flow rate of the ozone defined as 1. Further, the film with a higher carbon content is formed by controlling the flow rate of ethylene to be 1 to 2 with respect to the flow rate of the ozone defined as 1. Since TEOS is liquid at room temperature, it is possible to prevent adhesion of liquid TEOS to the degradable film 1' and reliably form the barrier film 3 with the use of a small amount of the raw material by controlling the flow rate of the TEOS to be 0.001 to 0.1 with respect to the flow rate of the ozone defined as 1. Each of the flow rates (sscm) of the ozone gas and the raw material gas can be determined based on a difference between primary and secondary pressures of a valve (flow rate control valve) mounted to the ozone gas or raw material gas supply pipe and a cross-sectional area of the ozone gas or raw material gas supply pipe. The flow rate of the ethylene gas can be determined by means of a mass flow meter mounted to the ethylene gas supply pipe. It is preferable to adopt the same conditions as those mentioned above even in the case of using an ozone gas with a different ozone concentration, any other kind of unsaturated hydrocarbon gas and/or any other kind of raw material gas.

Figure 3:
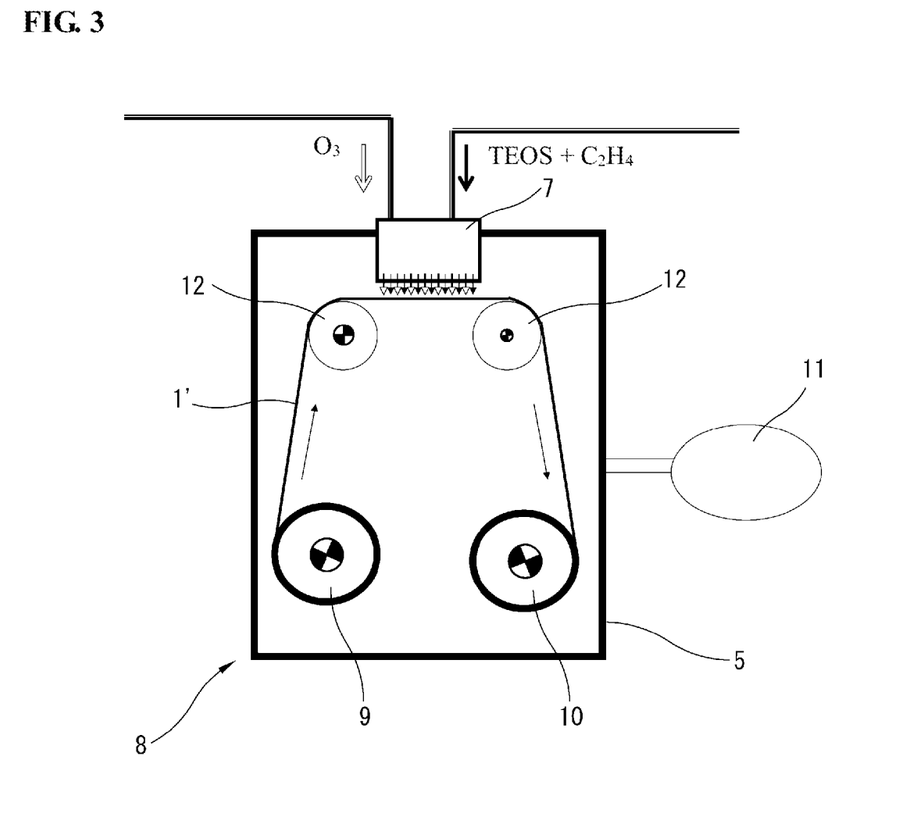
FIG. 3 is a cross-sectional overview of a film forming device according to a second embodiment example of the present invention.

A film forming device 8 according to a second embodiment example of the present invention is shown in FIG. 3. The film forming device 8 includes a pair of rolls 9 and 10 deposed in a vacuum chamber 5. The roll 9 is a roll around which the degradable film 1' has been wound, whereas the roll 10 is a roll by which the degradable film 1' fed from the roll 9 is would up.

The film forming device also includes a shower head 7 arranged in the vacuum chamber 5 such that an ozone gas, a raw material gas (e.g. TEOS-containing gas) and an unsaturated hydrocarbon gas (e.g. ethylene gas) are supplied from the shower head 7 to the degradable film 1' moving between the rolls 9 and 10. The supplied gases are reacted on the degradable film 1' and then evacuated from the vacuum chamber 5 by a vacuum pump 11. In this embodiment, feed rolls 12 are disposed in the vacuum chamber 5.

In the film forming device 8, a barrier film 3 is formed by CVD on the degradable film 1' while the degradable film 1' wound around the roll 9 is fed and moved to be wound up by the roll 10. The film deposition treatment conditions of the film forming device 8 are the same as those of the film forming device 4 in the first embodiment example. This treatment is performed by a so-called roll-to-roll process. The deposition of the barrier layer 3 by the roll-to-roll process enables mass production of the degradable film 1.

Figure 4:
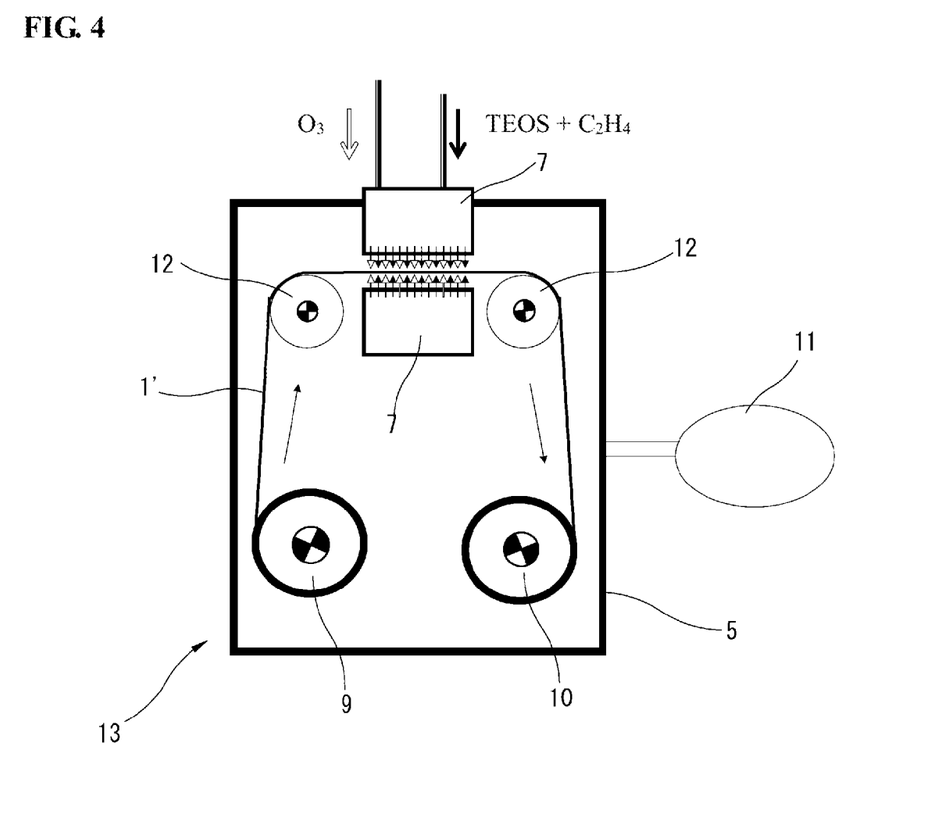
FIG. 4 is a cross-sectional overview of a film forming device according to a third embodiment example of the present invention.

A film forming device 13 according to a third embodiment example of the present invention is shown in FIG. 4. The film forming device 13 is different from the film forming device 8 according to the second embodiment example, in that a pair of shower heads 7 are provided. The shower heads 7 are arranged such that surfaces of the shower heads 7 in which gas supply holes are formed are opposed to each other. The degradable film 1' is fed to pass between these opposed shower heads 7. The film deposition treatment conditions of the film forming device 13 are the same as those of the film forming device 4 in the first embodiment example.

In the film forming device 13, the barrier layers 3 are simultaneously formed on both surfaces of the degradable film 1'. The film forming device 13 enables more efficient mass production of the degradable film 1 as compared to the film forming device 8 in which the barrier layer 3 is formed on one surface of the degradable film 1'.

Next, the process of decomposition of the degradable film 1 in seawater will be described below with reference to FIG. 5.

Figure 5:
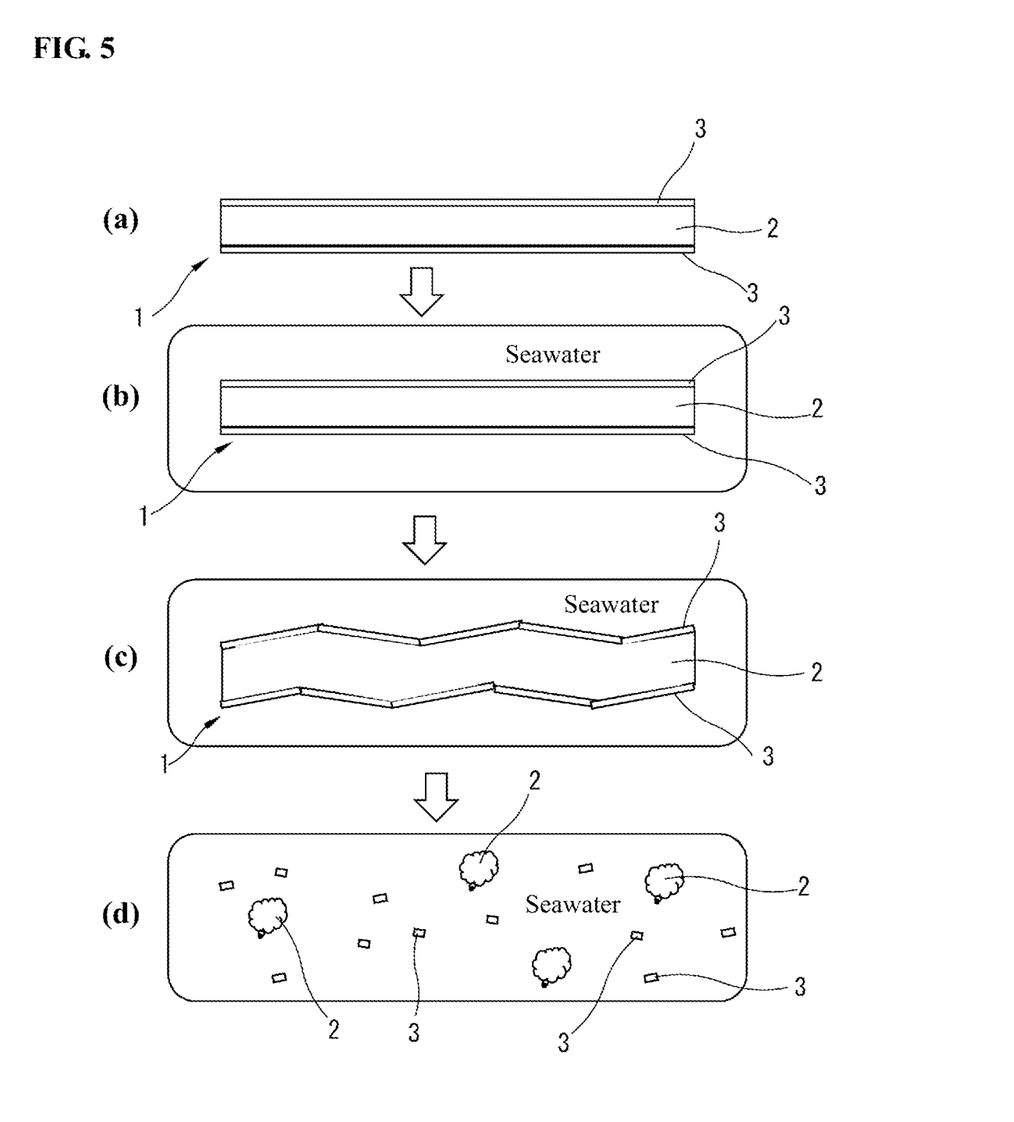

Although the water-soluble polymer layer 2 of the degradable film 1 is soluble in water, the surface of the degradable film 1 is covered by the barrier layer 3 as shown in FIG. 5(*a*) so that the degradable film 1 is usable for shopping bags, straws etc. like ordinary plastic products.

When the degradable film 1 is dumped into sea as shown in FIG. 5(*b*), the barrier layer 3 starts to allow a water component of seawater to permeate therethrough with the passage of time. Even though the barrier layer 3 has water resistance, the barrier property of the barrier layer 3 is against water vapor. Thus, the barrier property of the barrier layer 3 is lower in the case where the degradable film is immersed in water than in the case where the degradable film is not immersed in water.

With the passage of further time, the water component permeating through the barrier layer 3 reaches the water-soluble polymer layer 2 (see FIG. 5(*c*)). Then, the water-soluble polymer layer 2 starts to be dissolved and swollen by the water component. By the stress of swelling of the water-soluble polymer layer 2, there occurs an infinite number of cracks in the barrier layer 3. As a result, the barrier layer 3 gets decomposed into pieces. As the water resistance of the barrier layer 3 almost disappears by such shape decomposition of the barrier layer 3, the decomposition of the water-soluble polymer layer 2 becomes accelerated.

Finally, the water-soluble polymer layer 2 is totally dissolved and dispersed in the sea as shown in FIG. 5(*d*). Further, the barrier layer 3 is reduced to sand and dispersed. Since the barrier layer 3 is formed with a very small thickness of several tens IUD to several hundreds nm, the barrier layer 3 is reduced to sand and dispersed in the sea. It is thus considered that, even if the degradable film 1 is dumped in the sea, microplastics are not generated from the degradable film after the decomposition, whereby the environmental load of the degradable film 1 is significantly reduced as compared to those of conventional plastic containers.

In other words, the water resistance of the barrier layer 3 of the degradable film 1 is not semipermanent. After the lapse of a predetermined time, the barrier layer 3 allows permeation of water sufficient to dissolve the water-soluble polymer layer 2. It turns out that, even if the degradable film 1 is dumped in the sea, the water-soluble polymer layer (of e.g. PVA) gets dissolved by the water which has permeated through the barrier layer 3 (of e.g. $SiO_2$) during the lapse of a predetermined time.

The degradable film 1 and the production method of the degradable film 1 according to the above-described embodiments of the present invention are advantageous in that the degradable film 1 has less load on the environment even if dumped in sea and can be mass-produced. The degradable film 1 according to the above-described embodiment of the present invention has a structure in which the water-soluble polymer layer 2 with mechanical strength and water solubility is covered by the barrier layer 3 with less environmental load and non-semipermanent water resistance. As a consequence, the degradable film 1 is suitable for practical use and is less in environmental load even if dumped in the environment.

In particular, the degradable film 1 is made less in environmental load by forming the water-soluble polymer layer 2 of the degradable film 1 from PVA. There is no report on the harmfulness of PVA in the safety data sheet (SDS). Further, PVA is not used as pharmaceutical additives. It is thus assumed that, even if the PVA is dissolved in sea, the ecosystem is not particularly affected by the PVA.

The degradable film 1 is also made less in environmental load by forming the barrier layer 3 of the degradable film 1 from $SiO_2$. Since $SiO_2$ is a main component of stone (sand) or glass existing in the natural world, it is assumed that the ecosystem is not particularly affected by the $SiO_2$ when the $SiO_2$ is reduced to sand and dispersed.

Furthermore, the barrier layer 3 is formed, with a water vapor permeability generally ranging from 1 $mg/m^2/day$ to 10 $g/m^2/day$, by CVD using the raw material gas, the ozone gas and the unsaturated hydrocarbon gas as reactant gases. The water vapor permeability of the barrier layer 3 is adjusted by controlling the thickness of the barrier layer 3. The treatment time for deposition of the barrier layer 3 is decreased with decrease in the thickness of the barrier layer 3. This leads to improvement in the productivity of the degradable film 1. From the viewpoint of decreasing the decomposition time of the degradable film 1 in the event of dumping in sea, it is preferable that the water vapor permeability of the barrier layer 3 is lowered to a limit value required for practical use.

For example, in the case where the degradable film is used for a plastic product which is not brought into contact with water during use, such as shopping bag, the production cost of the plastic product can be decreased by decreasing the thickness of the $SiO_2$ film layer and thereby controlling the water vapor permeability of the $SiO_2$ film layer to be several $g/m^2/day$. In the case where the degradable film is used for a plastic product which is brought into contact with water during use, such as beverage container, the water-soluble polymer layer 2 is prevented from dissolving in water during the use by increasing the thickness of the $SiO_2$ film layer and thereby controlling the water vapor permeability of the $SiO_2$ film layer to be 10 $mg/m^2/day$ to 1 $g/m^2/day$. From the viewpoint of mass production, the treatment time for deposition of the barrier layer 3 is preferably 10 minutes or less, more preferably 10 seconds or less.

The unit "$g/m^2/day$" for the water vapor permeability of the barrier layer 3 expresses what grams of water vapor passes through a film of area 1 $mm^2$ per day. The water vapor permeability required of packaging for food, electronic components, pharmaceutical products etc. is 100 $mg/m^2/day$ to 100 $g/m^2/day$. Thus, the degradable film 1 with sufficient water resistance for practical use is obtained by adjusting the water vapor permeability of the barrier layer 3 to be 100 $mg/m^2/day$ to 100 $g/m^2/day$.

The PVA has not only mechanical strength as a plastic material, but also water resistance, and thus has conventionally been used only for special applications. On the other hand, the degradable film 1 according to the above-described embodiment of the present invention has a structure in which the surface of the water-soluble polymer layer 2 is covered by the $SiO_2$ film layer so as to impart water resistance. The degradable film 1 is therefore usable for various daily goods and disposable products such as shopping bags, packing bags, packaging materials, beverage containers, straws, muddlers, tablewear and the like. The problem of plastic waste is fundamentally resolved by using the degradable film 1 as an alternative to disposable plastics such as shopping bags, plastic bottles and straws.

The production method of the degradable film according to the above-described embodiment of the present invention is carried out by a film deposition process at room temperatures so that the barrier layer 3 is uniformly deposited without causing thermal or chemical damage to the degradable film 1 as the substrate. In one example, the barrier layer 3 can be deposited by this deposition process at a rate of 100 nm per 2 minutes; and the thus-obtained barrier layer 3 has a water vapor barrier property of 500 mg/m$^2$/day. This water vapor barrier property is in the water vapor barrier property range (100 mg/m$^2$/day to 100 g/m$^2$/day) required of packaging for food, electronic components, pharmaceutical etc. and is at a sufficient level for practical use.

By using OH radicals generated by the reaction of the ozone and the unsaturated hydrocarbon for the deposition process of the barrier layer 3, it is possible to improve the low-temperature deposition rate of the barrier layer 3 and to improve the adhesion between the water-soluble polymer layer 2 and the barrier layer 3. The improvement of the deposition rate of the barrier layer is due to incommensurably high reaction rate of the OH radicals against organic compounds than that of O radicals. The improvement of the adhesion between the water-soluble polymer layer 2 and the barrier layer 3 is due to formation of OH groups on the surface of the water-soluble polymer layer 2 or the surface of the oxide film by reaction of the OH radicals with the water-soluble polymer layer 2.

It is further possible to easily recycle the degradable film 1 by dissolving the degradable film 1 in water and extracting the water-soluble polymer layer 2. Thus, the degradable film 1 has improved recyclability.

Although the degradable resin molded article and the production method of the degradable resin molded article according to the present invention have been described above by way of the specific embodiments, the degradable resin molded article and the production method of the degradable resin molded article according to the present invention are not limited to those specific embodiments. Various modifications and variations of the above-described embodiments are possible within the range that does not impair the features of the present invention. All such modifications and variations fall within the technical scope of the present invention.

For example, the degradable resin molded article according to the present invention can be embodied by applying barrier layers to molded products (water-soluble polymer layers) of various shapes such as film shape, plate shape etc. although the above-described embodiment specifically refers to the degradable film 1.

The invention claimed is:

1. A production method of a degradable resin molded article, the degradable resin molded article having a barrier layer disposed on a surface of a water-soluble polymer layer, the water-soluble polymer layer containing polyvinyl alcohol or polyvinyl pyrrolidone, the barrier layer being a silicon oxide film or a silicon oxynitride film, the production method comprising:

placing the water-soluble polymer layer in a vacuum chamber; and supplying, to the water-soluble polymer layer placed in the vacuum chamber, an ozone gas with an ozone concentration of 20 vol % or higher, a raw material gas containing a compound containing silicon as a constituent element of the silicon oxide film or the silicon oxynitride film, and an unsaturated hydrocarbon gas, thereby forming the barrier layer on the water-soluble polymer layer, wherein the barrier layer has a thickness of 1 nm to 10 um and a water vapor permeability of 1 mg/m$^2$/day to 10 g/m$^2$/day, and wherein a flow rate of the ozone gas is in a range of 0.2 to 1000 sccm, wherein the ratio of a flow rate of the unsaturated hydrocarbon gas to the flow rate of the ozone gas is in a range of 0.1 to 2, and the ratio of a flow rate of the raw material gas to the flow rate of the ozone gas is 0.001 to 0.1.

2. The production method of the degradable resin molded article according to claim 1, wherein the compound is selected from the group consisting of silane, tetraethyl orthosilicate, trimethoxysilane, triethoxysilane or tris(dimethylamino)silane.

3. The production method of the degradable resin molded article according to claim 1, wherein, in the vacuum chamber, there are disposed: a first roll around which the water-soluble polymer layer has been wound; a second roll by which the water-soluble polymer layer fed from the first roll is wound up; and a shower head from which the ozone gas, the raw material gas and the unsaturated hydrocarbon gas are supplied to the water-soluble polymer layer, wherein the water-soluble polymer layer is fed from the first roll to the second roll and wound up by the second roll, and wherein the barrier layer is formed on the water-soluble polymer layer by supplying the ozone gas, the raw material gas and the unsaturated hydrocarbon gas from the shower head onto the water-soluble polymer layer moving between the first roll and the second roll.

4. The production method of the degradable resin molded article according to claim 3, wherein a pair of the shower heads are disposed in the vacuum chamber such that gas supply surfaces of the shower heads are opposed to each other, wherein the water-soluble polymer layer is fed to pass between the opposed shower heads, and wherein the barrier layers are formed on both surfaces of the water-soluble polymer layer by supplying the ozone gas, the raw material gas and the unsaturated hydrocarbon gas from the pair of the shower heads onto the water-soluble polymer layer moving between the first roll and the second roll.

5. The production method of the degradable resin molded article according to claim 1, wherein the barrier layer is formed under room temperature conditions.

* * * * *